United States Patent
Yamane et al.

(10) Patent No.: US 12,074,082 B2
(45) Date of Patent: Aug. 27, 2024

(54) SEMICONDUCTOR MODULE AND POWER CONVERSION DEVICE

(71) Applicant: Mitsubishi Electric Corporation, Tokyo (JP)

(72) Inventors: Tomohisa Yamane, Tokyo (JP); Hisayuki Taki, Tokyo (JP); Noriyuki Besshi, Tokyo (JP); Yuya Muramatsu, Tokyo (JP); Masaru Fuku, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 416 days.

(21) Appl. No.: 17/604,774

(22) PCT Filed: Jun. 6, 2019

(86) PCT No.: PCT/JP2019/022615
§ 371 (c)(1),
(2) Date: Oct. 19, 2021

(87) PCT Pub. No.: WO2020/245996
PCT Pub. Date: Dec. 10, 2020

(65) Prior Publication Data
US 2022/0208636 A1 Jun. 30, 2022

(51) Int. Cl.
*H01L 23/34* (2006.01)
*H01L 23/31* (2006.01)
(Continued)

(52) U.S. Cl.
CPC .......... *H01L 23/3675* (2013.01); *H01L 23/31* (2013.01); *H02M 7/003* (2013.01); *H01L 2924/181* (2013.01)

(58) Field of Classification Search
CPC ........... H01L 2924/181; H01L 23/3107; H01L 23/3121; H01L 23/4334; H01L 23/26; H01L 23/49562
(Continued)

(56) References Cited

U.S. PATENT DOCUMENTS

2003/0090915 A1    5/2003   Nakamura et al.
2007/0052072 A1    3/2007   Iwade et al.
(Continued)

FOREIGN PATENT DOCUMENTS

DE    102011088218 A1       6/2013
DE    102019218672 A1  *    6/2020   ........... H01L 23/053
(Continued)

OTHER PUBLICATIONS

International Search Report and Written Opinion mailed on Aug. 20, 2019, received for PCT Application PCT/JP2019/022615, Filed on Jun. 6, 2019, 12 pages including English Translation.
Notice of Reasons for Refusal mailed on Feb. 4, 2020, received for JP Application 2019-561332, 14 pages Including English Translation.
Office Action issued on May 31, 2022, in corresponding German patent Application No. 112019007411.3, 15 pages.

*Primary Examiner* — Caleb E Henry
*Assistant Examiner* — Dilinh P Nguyen
(74) *Attorney, Agent, or Firm* — XSENSUS LLP (57) ABSTRACT

A reliable semiconductor module and a reliable power conversion device using the semiconductor module are obtained. A semiconductor module includes a heat dissipation member, a semiconductor device, and a thermally conductive insulating resin sheet. The thermally conductive insulating resin sheet connects the heat dissipation member and the semiconductor device. The semiconductor device includes a semiconductor element and a metal wiring member. The metal wiring member is electrically connected to the semiconductor element. The metal wiring member
(Continued)

includes a terminal portion protruding outside the semiconductor device. In a surface portion of the semiconductor device, a concave portion is formed outward of a partial region to which the thermally conductive insulating resin sheet is connected. The concave portion is located in a region closer to the heat dissipation member than the terminal portion.

4 Claims, 6 Drawing Sheets

(51) Int. Cl.
*H01L 23/367* (2006.01)
*H02M 7/00* (2006.01)

(58) Field of Classification Search
USPC .......................................................... 257/712
See application file for complete search history.

(56) References Cited

U.S. PATENT DOCUMENTS

| 2014/0293548 A1 | 10/2014 | Besshi et al. |
| 2019/0067154 A1 | 2/2019 | Yoshihara et al. |

FOREIGN PATENT DOCUMENTS

| JP | 6-61284 A | 3/1994 | |
| JP | 2003-153554 A | 5/2003 | |
| JP | 2003-168772 A | 6/2003 | |
| JP | 2012-4358 A | 1/2012 | |
| JP | 2017-22209 A | 1/2017 | |
| JP | 2017-200315 A | 11/2017 | |
| WO | 2013/099545 A1 | 7/2013 | |
| WO | 2017/175612 A1 | 10/2017 | |
| WO | WO-2020174584 A1 * | 9/2020 | ........... H01L 23/315 |

* cited by examiner

SEMICONDUCTOR MODULE AND POWER CONVERSION DEVICE

CROSS-REFERENCE TO RELATED APPLICATION

The present application is based on PCT filing PCT/JP2019/022615, filed Jun. 6, 2019, the entire contents of which are incorporated herein by reference.

TECHNICAL FIELD

The present invention relates to a semiconductor module and a power conversion device.

BACKGROUND ART

Conventionally, a semiconductor module has been known in which a semiconductor device is connected to a heat dissipation member by a thermally conductive insulating resin sheet (see Japanese Patent Laying-Open No. 2003-153554, for example). Such a semiconductor module is used for a power conversion device, for example. In Japanese Patent Laying-Open No. 2003-153554, a semiconductor device is fixed to a heat dissipation member by a thermally conductive insulating resin sheet that is adhesive and insulating in addition to being heat-dissipating.

CITATION LIST

Patent Literature

PTL 1: Japanese Patent Laying-Open No. 2003-153554

SUMMARY OF INVENTION

Technical Problem

A thermally conductive insulating resin sheet as described above is required to be highly thermally conductive, insulating and adhesive. Therefore, a thermally conductive resin composite made by impregnating an inorganic substance with a thermosetting resin, for example, is used as the thermally conductive insulating resin sheet. Unlike grease or a heat dissipation sheet conventionally used for a connection portion between a semiconductor device and a heat dissipation member, such a thermally conductive insulating resin sheet is harder and less likely to deform. Thus, if there are minute scratches or dents, such as ejector pin marks produced when a semiconductor device is released from a die after having been molded with a molding resin, on a surface of the semiconductor device that is connected to the thermally conductive insulating resin sheet, then connection strength, heat dissipation performance and insulation performance may be degraded at a connection portion between the thermally conductive insulating resin sheet and the semiconductor device. That is, the reliability of a semiconductor module may be reduced due to the scratches or dents as described above.

The present invention was made to solve the problem as described above, and an object of the present invention is to provide a reliable semiconductor module and a reliable power conversion device using the semiconductor module.

Solution to Problem

A semiconductor module according to the present disclosure includes a heat dissipation member, a semiconductor device, and a thermally conductive insulating resin sheet. The heat dissipation member has a first surface. The semiconductor device is disposed on the first surface. The semiconductor device has a surface portion facing the heat dissipation member. The thermally conductive insulating resin sheet connects the heat dissipation member and the semiconductor device. Specifically, the thermally conductive insulating resin sheet connects a portion of the first surface of the heat dissipation member and a partial region of the surface portion of the semiconductor device. The semiconductor device includes a semiconductor element and a metal wiring member. The metal wiring member is electrically connected to the semiconductor element. The metal wiring member includes a terminal portion protruding outside the semiconductor device. In the surface portion of the semiconductor device, a concave portion is formed outward of the partial region to which the thermally conductive insulating resin sheet is connected. The concave portion is located in a region closer to the heat dissipation member than the terminal portion.

A power conversion device according to the present disclosure includes a main conversion circuit and a control circuit. The main conversion circuit includes the semiconductor module described above. The main conversion circuit converts input power and outputs the converted power. The control circuit outputs a control signal for controlling the main conversion circuit to the main conversion circuit.

Advantageous Effects of Invention

According to the above, in the surface portion of the semiconductor device, the concave portion is formed outward of the partial region to which the thermally conductive insulating resin sheet is connected. Thus, a reliable semiconductor module and a reliable power conversion device using the semiconductor module are obtained.

DESCRIPTION OF EMBODIMENTS

In the following, embodiments of the present invention will be described. Note that the same elements are designated by the same reference numbers and a description thereof will not be repeated.

First Embodiment

<Configuration of Semiconductor Module>

Figure 1:
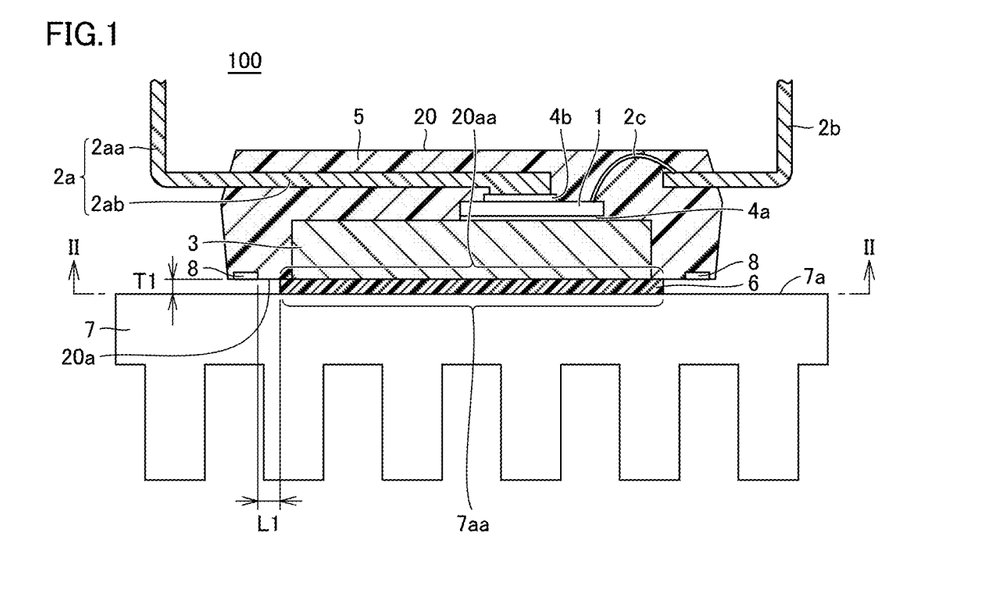
FIG. 1 is a schematic cross-sectional view of a semiconductor module according to a first embodiment.
Figure 2:
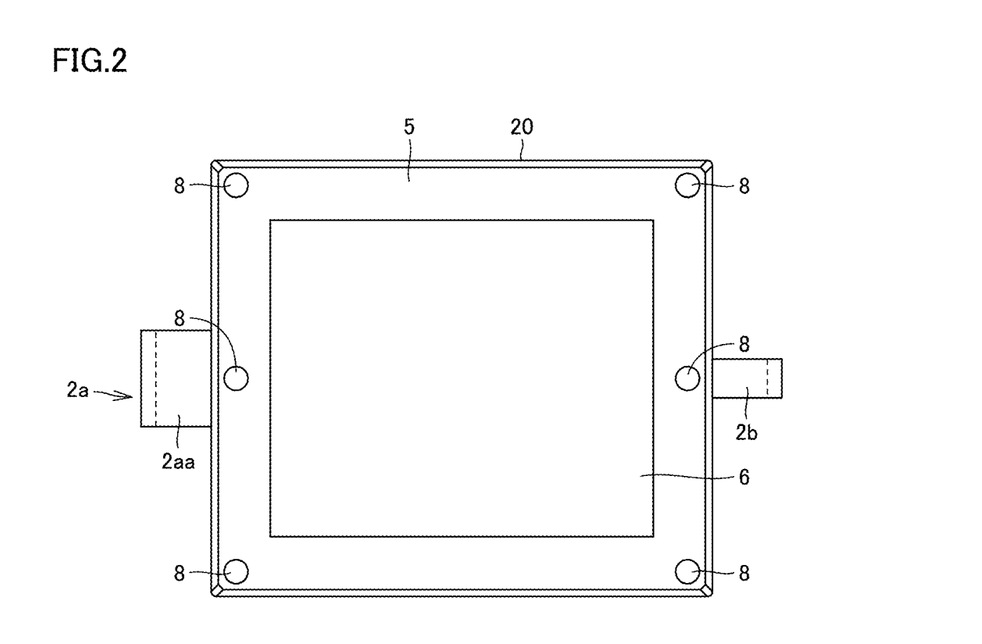
FIG. 2 is a schematic cross-sectional view taken along line II-II in FIG. 1.

FIG. 1 is a schematic cross-sectional view of a semiconductor module according to a first embodiment. FIG. 2 is a schematic cross-sectional view taken along line II-II in FIG. 1.

A semiconductor module 100 shown in FIGS. 1 and 2 mainly includes a heat dissipation member 7, a semiconductor device 20, and a thermally conductive insulating resin sheet 6. Heat dissipation member 7 has a first surface 7a. Semiconductor device 20 is disposed on first surface 7a. Semiconductor device 20 has a surface portion 20a facing heat dissipation member 7. Thermally conductive insulating resin sheet 6 connects a portion 7aa of first surface 7a of heat dissipation member 7 and a partial region 20aa of surface portion 20a of semiconductor device 20. In surface portion 20a of semiconductor device 20, concave portions 8 are formed outward of partial region 20aa to which thermally conductive insulating resin sheet 6 is connected.

For purposes of description, the following references may be used herein for the surfaces of members of semiconductor module 100 described below. That is, the side of heat dissipation member 7 on which fin portions are formed may be referred to as a lower side of heat dissipation member 7, the first surface 7a side may be referred to as an upper side, and first surface 7a may be referred to as an upper surface. In regard to thermally conductive insulating resin sheet 6, a surface on the heat dissipation member 7 side may be referred to as a lower surface, and a surface on the semiconductor device 20 side may be referred to as an upper surface. In regard to semiconductor device 20, a surface flush with partial region 20aa of surface portion 20a that is bonded to thermally conductive insulating resin sheet 6 may be referred to as a lower surface, and a surface located opposite to the lower surface may be referred to as an upper surface. A surface of semiconductor device 20 that connects the aforementioned lower surface and the aforementioned upper surface may be referred to as a side surface. The aforementioned references may also be used when heat dissipation member 7 is disposed on the upper surface side or the side surface side of semiconductor device 20.

Semiconductor device 20 mainly includes a semiconductor element 1, a heat spreader 3, metal wiring members 2a, 2b and a wire 2c, and a molding resin portion 5. Semiconductor element 1 is a power semiconductor element, for example. Semiconductor element 1 is connected to an upper surface of heat spreader 3 by a bonding member 4a. Heat spreader 3 has a quadrangular shape, for example, in a plan view. Semiconductor element 1 is connected to metal wiring member 2a by a bonding member 4b. Specifically, bonding member 4b connects a not-shown electrode formed on an upper surface of semiconductor element 1 and metal wiring member 2a. Semiconductor element 1 is also connected to metal wiring member 2b via wire 2c.

Molding resin portion 5 is formed to hold and seal therein part of metal wiring members 2a and 2b, semiconductor element 1, and heat spreader 3. Metal wiring member 2a includes a terminal portion 2aa protruding outside semiconductor device 20, and a connection portion 2ab continuous with terminal portion 2aa and located within molding resin portion 5. Connection portion 2ab extends from an end of terminal portion 2aa on the semiconductor element 1 side onto semiconductor element 1. Metal wiring member 2b also includes a terminal portion protruding outside semiconductor device 20, and a connection portion continuous with this terminal portion and located within molding resin portion 5. Terminal portion 2aa of metal wiring member 2a and the terminal portion of metal wiring member 2b are portions connected to the outside. Depending on the circuit configuration, terminal portion 2aa may be connected to heat spreader 3, instead of only to semiconductor element 1.

A lower surface of heat spreader 3 opposite to the upper surface on the semiconductor element 1 side is exposed at a surface of molding resin portion 5. In other words, the lower surface of heat spreader 3 is exposed at a lower surface of semiconductor device 20. The lower surface of heat spreader 3 and part of the surface of molding resin portion 5 adjacent to this lower surface form partial region 20aa of surface portion 20a of semiconductor device 20. Partial region 20aa is connected to an upper surface of thermally conductive insulating resin sheet 6. Portion 7aa of first surface 7a, which is an upper surface of heat dissipation member 7, is connected to a lower surface of thermally conductive insulating resin sheet 6.

In the lower surface of semiconductor device 20, concave portions 8 are formed outward of an outer periphery of thermally conductive insulating resin sheet 6. Concave portions 8 are regions where the surface of molding resin portion 5 is depressed. Concave portions 8 are located in a region closer to heat dissipation member 7 than terminal portion 2aa and the connection portion of metal wiring member 2b. Surface portion 20a of semiconductor device 20 facing heat dissipation member 7 includes the lower surface and part of a side surface of semiconductor device 20 that are visible from the heat dissipation member 7 side, as shown in FIG. 2.

Any material can be used for bonding members 4a and 4b, for example, a metal such as solder, silver (Ag) or aluminum (Al) can be used. Any material can also be used for metal wiring members 2a and 2b, for example, a metal such as copper (Cu) or aluminum (Al), or an alloy including these metals can be used. Any material can be used for wire 2c, for example, a metal such as copper (Cu) or aluminum (Al), or an alloy including these metals can be used.

A voltage-driven MOS-FET (metal-oxide-semiconductor field-effect transistor), an IGBT (Insulated Gate Bipolar Transistor), or a diode can be used, for example, as semiconductor element 1. A so-called next-generation semiconductor, including wide band gap semiconductors such as silicon nitride (SiN), gallium nitride and silicon carbide can be used, other than silicon, as a material forming semiconductor element 1. Semiconductor element 1 serves as a main heat generating source in semiconductor module 100.

Heat dissipation member 7 diffuses heat generated by semiconductor element 1 during operation to the outside. Heat dissipation member 7 is a so-called heat sink. A metal such as aluminum (Al) or copper (Cu) can be used, for example, as a material forming heat dissipation member 7. A non-insulating material can be used as a material forming heat dissipation member 7. Heat dissipation member 7 has a plurality of fins provided at its lower side in order to improve heat dissipation, as shown in FIG. 1. A duct through which a cooling medium flows may be formed within heat dissipation member 7. The duct may be connected to a heat exchange unit such as a not-shown radiator disposed outside heat dissipation member 7. The duct and the heat exchange unit preferably form a circuit that allows the medium to circulate therethrough. The medium may be passed through the duct to forcibly cool heat dissipation member 7. Water can be used, for example, as the medium.

A sheet-like member made by impregnating a ceramic with a thermosetting resin can be used, for example, as thermally conductive insulating resin sheet 6. Thermally conductive insulating resin sheet 6 may include air (voids) therein. If such voids exist within thermally conductive insulating resin sheet 6, the voids serve as a starting point of partial discharge according to Paschen's law. This may result in reduced insulation of thermally conductive insulating resin sheet 6.

In order to prevent the reduced insulation due to the voids remaining in thermally conductive insulating resin sheet 6, and to bond semiconductor device 20 and heat dissipation member 7 together more firmly, pressure and heat are applied to thermally conductive insulating resin sheet 6 during the bonding. Specifically, with semiconductor device 20, thermally conductive insulating resin sheet 6 and heat dissipation member 7 being stacked on one another, thermally conductive insulating resin sheet 6 is heated while a pressure within a range that does not cause a breakdown of semiconductor device 20 is applied in the stacking direction. Semiconductor device 20 and heat dissipation member 7 are bonded together by thermally conductive insulating resin sheet 6 in this manner. During the bonding process by pressurization and heating as described above, a resin (for example, a thermosetting resin) within thermally conductive insulating resin sheet 6 temporarily decreases in viscosity. As a result, the air and the resin included in thermally conductive insulating resin sheet 6 flow together.

At this time, the air and the resin flowing within thermally conductive insulating resin sheet 6 flow uniformly, if a gap between semiconductor device 20 and heat dissipation member 7 is constant. If there is a concave portion in partial region 20*aa* of semiconductor device 20 in contact with thermally conductive insulating resin sheet 6, however, the gap of a space where thermally conductive insulating resin sheet 6 is located widens only in a region where the concave portion exists. As a result, the air and the resin tend to be concentrated in a region of thermally conductive insulating resin sheet 6 facing the concave portion. In particular, the concentration of air may result in significantly degraded insulation performance of the region. In addition, if the concave portion has a depth much deeper than the thickness of thermally conductive insulating resin sheet 6, the concave portion is not filled with the resin, resulting in reduced bonding strength of thermally conductive insulating resin sheet 6 in the vicinity of the concave portion. As with concave portion 8 shown in FIGS. 1 and 2, for example, such a concave portion is formed when the surface of semiconductor device 20 is pressed by a pin, which is called an ejector pin, that presses semiconductor device 20 out of a molding die after semiconductor device 20 has been molded. A scratch produced on the surface of semiconductor device 20, or a portion of molding resin portion 5 where a sink mark has been produced also corresponds to the concave portion.

In semiconductor module 100 shown in FIGS. 1 and 2, concave portion 8 described above is formed in semiconductor device 20 below metal wiring members 2*a* and 2*b*, that is, closer to heat dissipation member 7 than metal wiring members 2*a* and 2*b*. Concave portion 8 is also disposed outward of the region of surface portion 20*a* of semiconductor device 20 that is bonded to thermally conductive insulating resin sheet 6. Therefore, during the bonding process by pressurization and heating of thermally conductive insulating resin sheet 6 as described above, the occurrence of a phenomenon in which the resin and the air flowing within thermally conductive insulating resin sheet 6 are concentrated in the vicinity of concave portion 8 can be prevented. Accordingly, a partial discharge starting voltage at thermally conductive insulating resin sheet 6 can be improved. As a result, the insulation reliability of semiconductor module 100 can be improved. At the same time, the resin within thermally conductive insulating resin sheet 6 is uniformly distributed, thus also leading to improved adhesion of thermally conductive insulating resin sheet 6. As a result, the reliability of semiconductor module 100 can be improved.

If concave portions 8 described above are impressions caused by the ejector pin, concave portions 8 are preferably provided at an outer peripheral portion of the lower surface of semiconductor device 20 as shown in FIG. 2, in view of releasability during the removal of semiconductor device 20 from the molding die after the molding of semiconductor device 20. Concave portion 8 is preferably arranged such that a distance L1 between concave portion 8 and the end of thermally conductive insulating resin sheet 6 is sufficiently large. In this manner, both the releasability during the molding of semiconductor device 20, and the insulation and adhesion in semiconductor module 100 using semiconductor device 20 can be attained at the same time.

Concave portion 8 described above is preferably disposed in an area that is not affected by the resin and the air (voids) within thermally conductive insulating resin sheet 6. For example, distance L1 described above is preferably set to be greater than a thickness T1 of thermally conductive insulating resin sheet 6.

<Functions and Advantageous Effects>

Semiconductor module 100 according to the present disclosure mainly includes heat dissipation member 7, semiconductor device 20, and thermally conductive insulating resin sheet 6. Heat dissipation member 7 has first surface 7*a*. Semiconductor device 20 is disposed on first surface 7*a*. Semiconductor device 20 has surface portion 20*a* facing heat dissipation member 7. Thermally conductive insulating resin sheet 6 connects heat dissipation member 7 and semiconductor device 20. Specifically, thermally conductive insulating resin sheet 6 connects portion 7*aa* of first surface 7*a* of heat dissipation member 7 and partial region 20*aa* of surface portion 20*a* of semiconductor device 20. Semiconductor device 20 includes semiconductor element 1 and metal wiring member 2*a*. Metal wiring member 2*a* is electrically connected to semiconductor element 1. Metal wiring member 2*a* includes terminal portion 2*aa* protruding outside semiconductor device 20. In surface portion 20*a* of semiconductor device 20, concave portion 8 is formed outward of partial region 20*aa* to which thermally conductive insulating resin sheet 6 is connected. Concave portion 8 is located in a region closer to heat dissipation member 7 than terminal portion 2*aa*.

In this manner, concave portion 8 is not disposed in the region in contact with thermally conductive insulating resin sheet 6. Therefore, during the process of bonding semiconductor device 20 and heat dissipation member 7 by pressurization and heating of thermally conductive insulating resin sheet 6, the occurrence of a phenomenon in which the resin and the air flowing within thermally conductive insulating resin sheet 6 are concentrated in the vicinity of concave portion 8 can be prevented. Accordingly, reduction in the partial discharge starting voltage at thermally conductive insulating resin sheet 6 can be suppressed. As a result, the insulation reliability of semiconductor module 100 can be improved. At the same time, the resin within thermally conductive insulating resin sheet 6 is uniformly distributed, thus also leading to improved adhesion of thermally conductive insulating resin sheet 6. As a result, the reliability of semiconductor module 100 can be improved.

Portion 7aa of first surface 7a of heat dissipation member 7 preferably has the same degree of flatness as that of a rear surface of thermally conductive insulating resin sheet 6. Partial region 20aa of surface portion 20a of semiconductor device 20 preferably has the same degree of flatness as that of the upper surface of thermally conductive insulating resin sheet 6. It is preferable that a concave portion having a depth of 0.1 mm or more not be formed in portion 7aa of first surface 7a of heat dissipation member 7, and in partial region 20aa of surface portion 20a of semiconductor device 20.

Second Embodiment

<Configuration of Semiconductor Module>

Figure 3:
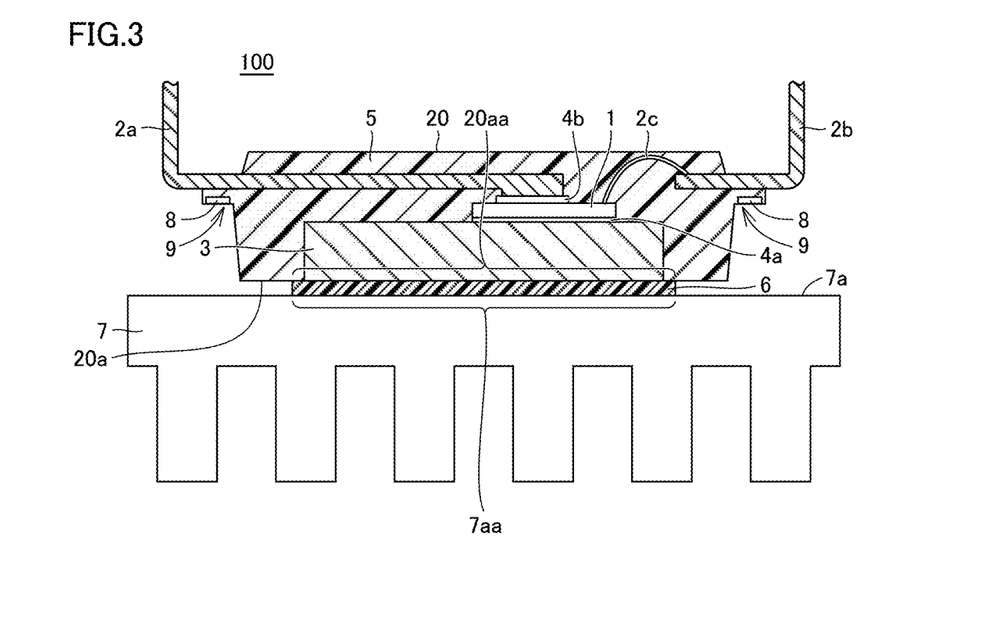
FIG. 3 is a schematic cross-sectional view of a semiconductor module according to a second embodiment.
Figure 4:
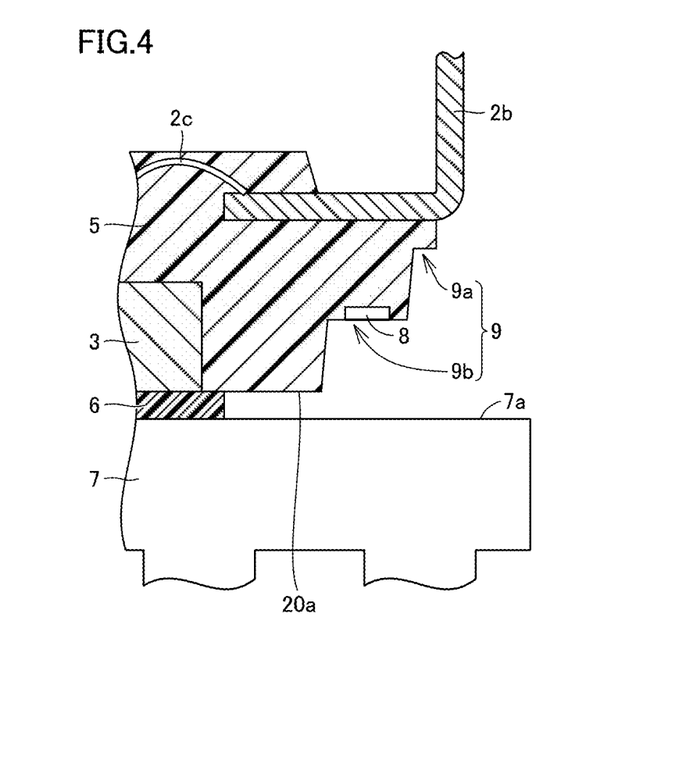
FIG. 4 is an enlarged partial schematic cross-sectional view showing a modification of the semiconductor module according to the second embodiment.

FIG. 3 is a schematic cross-sectional view of a semiconductor module according to a second embodiment. FIG. 4 is an enlarged partial schematic cross-sectional view showing a modification of the semiconductor module according to the second embodiment.

Semiconductor module 100 shown in FIG. 3 basically has a similar configuration and can produce similar effects to those of semiconductor module 100 shown in FIGS. 1 and 2, but is different from semiconductor module 100 shown in FIGS. 1 and 2 in the structure of a region of semiconductor device 20 where concave portion 8 is formed. Specifically, in semiconductor module 100 shown in FIG. 3, surface portion 20a of semiconductor device 20 includes a step portion 9. Step portion 9 is located outward of partial region 20aa. Step portion 9 is formed in the side surface of semiconductor device 20, in a region closer to heat dissipation member 7 than metal wiring members 2a and 2b. Step portion 9 is further away from heat dissipation member 7 than partial region 20aa. In a plan view, step portion 9 overlaps a portion of each of metal wiring members 2a and 2b. Concave portion 8 is formed in step portion 9. From a different viewpoint, concave portion 8 is arranged further away from heat dissipation member 7 than the upper surface of heat spreader 3.

In this case, since step portion 9 is formed in semiconductor device 20, and concave portion 8 is formed in step portion 9, a creepage distance between metal wiring members 2a, 2b exposed through molding resin portion 5 of semiconductor device 20 and heat dissipation member 7 can be increased relative to when step portion 9 and concave portion 8 are not formed. Accordingly, size reduction of semiconductor module 100 can be achieved while the insulation performance is maintained.

Semiconductor module 100 shown in FIG. 4 basically has a similar configuration and can produce similar effects to those of semiconductor module 100 shown in FIG. 3, but is different from semiconductor module 100 shown in FIG. 3 in the structure of a region of semiconductor device 20 where concave portion 8 is formed. Specifically, in semiconductor module 100 shown in FIG. 4, step portion 9 formed at the outer peripheral portion of surface portion 20a of semiconductor device 20 includes a first step 9a and a second step 9b. Concave portion 8 is formed in second step 9b. In surface portion 20a, first step 9a is disposed closer to the outer periphery than second step 9b. A distance between first step 9a and first surface 7a of heat dissipation member 7 is greater than a distance between second step 9b and first surface 7a of heat dissipation member 7.

In this case, since step portion 9 has a multistep configuration, the creepage distance between metal wiring members 2a, 2b exposed through molding resin portion 5 of semiconductor device 20 and heat dissipation member 7 can be increased relative to the creepage distance in semiconductor module 100 shown in FIG. 3. The number of steps included in step portion 9 is not limited to two as shown in FIG. 4, and three or more steps may be included.

<Functions and Advantageous Effects>

In semiconductor module 100 described above, surface portion 20a of semiconductor device 20 includes step portion 9. Step portion 9 is located outward of partial region 20aa. Step portion 9 is further away from heat dissipation member 7 than partial region 20aa. In a plan view, step portion 9 overlaps a portion of each of metal wiring members 2a and 2b. Concave portion 8 is formed in step portion 9.

In this case, since step portion 9 is formed in semiconductor device 20 at a position overlapping each of metal wiring members 2a and 2b in a plan view, and concave portion 8 is formed in step portion 9, the creepage distance between metal wiring members 2a, 2b exposed through molding resin portion 5 of semiconductor device 20 and heat dissipation member 7 can be increased relative to when step portion 9 and concave portion 8 are not formed. As a result, the insulation performance of semiconductor module 100 can be improved, and therefore, size reduction of semiconductor module 100 can be achieved while the insulation performance is maintained.

Third Embodiment

<Configuration of Semiconductor Module>

Figure 5:
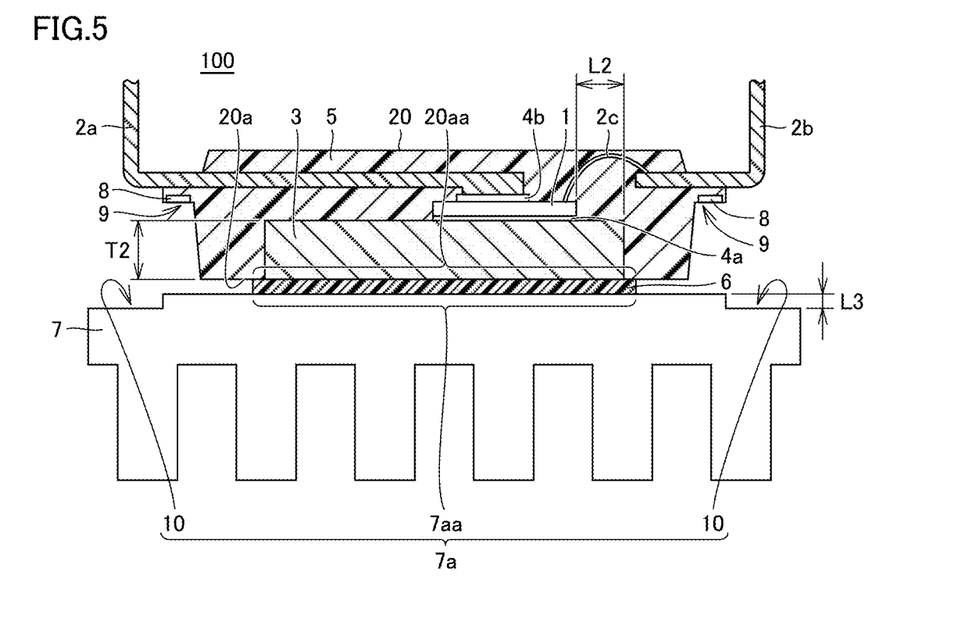
FIG. 5 is a schematic cross-sectional view of a semiconductor module according to a third embodiment.

FIG. 5 is a schematic cross-sectional view of a semiconductor module according to a third embodiment.

Semiconductor module 100 shown in FIG. 5 basically has a similar configuration and can produce similar effects to those of semiconductor module 100 shown in FIG. 3, but is different from semiconductor module 100 shown in FIG. 3 in that a heat-dissipation-member-side step portion 10 is formed in an outer peripheral portion of first surface 7a of heat dissipation member 7. Specifically, in semiconductor module 100 shown in FIG. 5, in a part of first surface 7a of heat dissipation member 7 that is located outward of portion 7aa connected to thermally conductive insulating resin sheet 6, heat-dissipation-member-side step portion 10 which is further away from semiconductor device 20 than portion 7aa is formed. In a plan view of semiconductor module 100, heat-dissipation-member-side step portion 10 partially overlaps each of metal wiring members 2a and 2b. Heat-dissipation-member-side step portion 10 may be formed to surround the outer periphery of thermally conductive insulating resin sheet 6.

In this case, a spatial distance between metal wiring members 2a, 2b and heat dissipation member 7 is increased compared to that of semiconductor module 100 shown in FIG. 3. It is therefore unnecessary to implement measures that would result in an increased size of semiconductor module 100, such as increasing a thickness T2 of heat spreader 3, or increasing the thickness of bonding members 4a and 4b, or increasing the thickness of semiconductor element 1, in order to increase the spatial distance. Therefore, size increase of semiconductor module 100 can be suppressed, and together with the formation of step portion 9 in semiconductor device 20, size and cost reductions of semiconductor module 100 can be achieved.

Here, in view of manufacturability of semiconductor module 100, a depth L3 of heat-dissipation-member-side step portion 10 can be set as described below, for example. In semiconductor module 100 shown in FIG. 5, a distance L2 from the end of heat spreader 3 to semiconductor element 1 is approximately 2 mm at a minimum, for example. In regard to heat spreading at heat spreader 3, it is assumed that a heat spreading angle is approximately 45°. In this case, a thickness T3 of heat spreader 3 needs to be approximately 2 mm in order to sufficiently spread heat at heat spreader 3. Further, in this case, setting thickness T3 of heat spreader 3 to 2 mm or more would end up increasing adverse effects due to increased thermal resistance. On the other hand, when considering semiconductor device 20 having a breakdown voltage of 1200 V, for example, the spatial distance needs to be 2.6 mm or more, assuming the worst-case condition. By setting depth L3 of heat-dissipation-member-side step portion 10 to 0.6 mm or more, therefore, the insulation of semiconductor module 100 can be secured without unnecessarily increasing the thickness of heat spreader 3 to ensure the creepage distance. As a result, size and cost reductions of semiconductor module 100 can be achieved.

<Functions and Advantageous Effects>

In semiconductor module 100 described above, a part of first surface 7a of heat dissipation member 7 that overlaps each of metal wiring members 2a and 2b in a plan view and that is located outward of portion 7aa connected to thermally conductive insulating resin sheet 6 includes heat-dissipation-member-side step portion 10 which is further away from semiconductor device 20 than portion 7aa.

In this case, the spatial distance between metal wiring members 2a, 2b and heat dissipation member 7 can be relatively increased. It is therefore unnecessary to implement measures such as increasing the thicknesses of the components of semiconductor device 20 such as heat spreader 3 in order to increase the spatial distance. Therefore, size increase of semiconductor module 100 can be suppressed, and size and cost reductions of semiconductor module 100 can be achieved.

Fourth Embodiment

<Configuration of Semiconductor Module>

Figure 6:
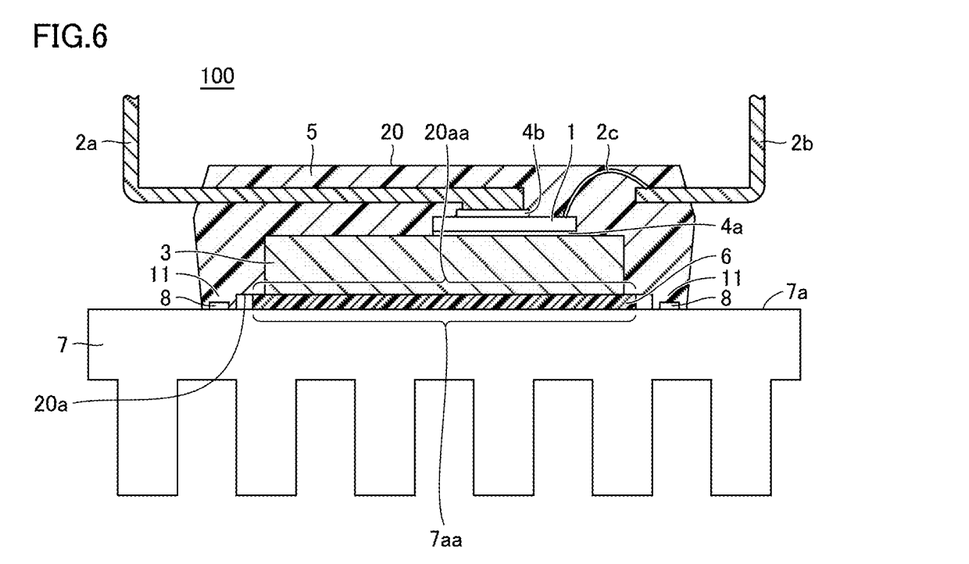
FIG. 6 is a schematic cross-sectional view of a semiconductor module according to a fourth embodiment.
Figure 7:
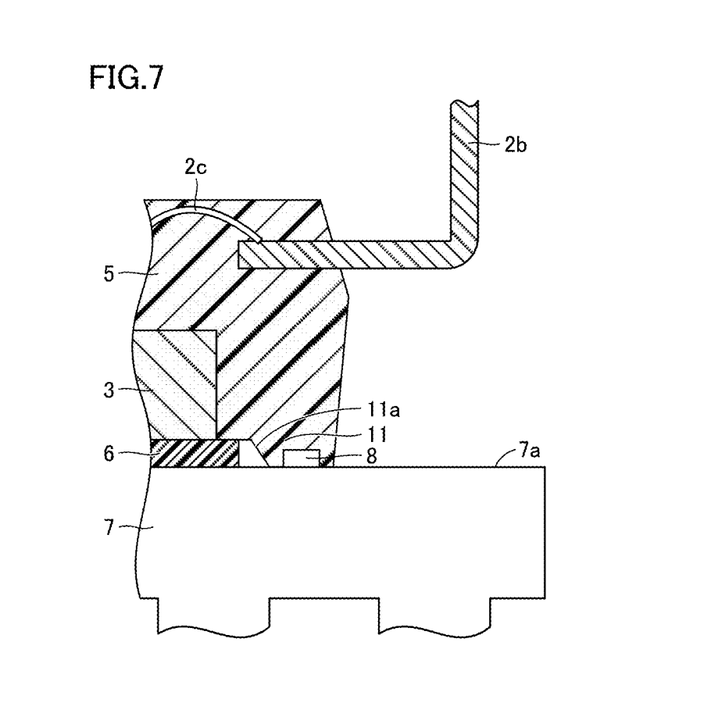
FIG. 7 is an enlarged partial schematic cross-sectional view showing a first modification of the semiconductor module according to the fourth embodiment.
Figure 8:
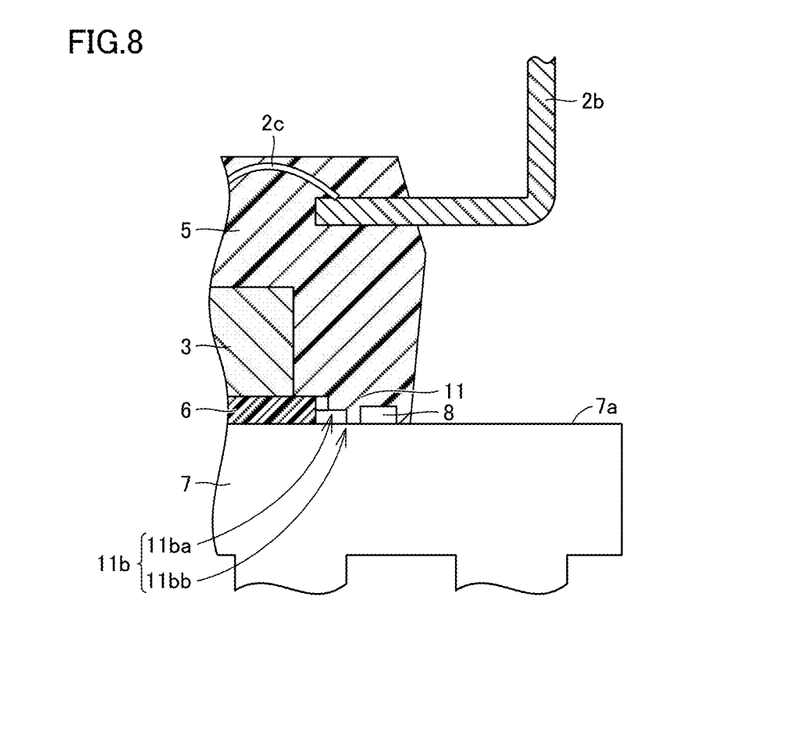
FIG. 8 is an enlarged partial schematic cross-sectional view showing a second modification of the semiconductor module according to the fourth embodiment.

FIG. 6 is a schematic cross-sectional view of a semiconductor module according to a fourth embodiment. FIG. 7 is an enlarged partial schematic cross-sectional view showing a first modification of the semiconductor module according to the fourth embodiment. FIG. 8 is an enlarged partial schematic cross-sectional view showing a second modification of the semiconductor module according to the fourth embodiment.

Semiconductor module 100 shown in FIG. 6 basically has a similar configuration and can produce similar effects to those of semiconductor module 100 shown in FIGS. 1 and 2, but is different from semiconductor module 100 shown in FIGS. 1 and 2 in the structure of a region of semiconductor device 20 where concave portion 8 is formed. Specifically, in semiconductor module 100 shown in FIG. 6, a convex portion 11 surrounding the outer periphery of thermally conductive insulating resin sheet 6 is formed at surface portion 20a of semiconductor device 20. A portion of a surface of convex portion 11 is in contact with first surface 7a of heat dissipation member 7. Concave portion 8 is formed in the portion of the surface of convex portion 11 in contact with first surface 7a. Convex portion 11 is formed at an outer peripheral portion of a surface portion of molding resin portion 5 facing heat dissipation member 7.

In this case, since convex portion 11 and first surface 7a of heat dissipation member 7 are in contact with each other, during the bonding of semiconductor device 20 and heat dissipation member 7 by pressurization and heating of thermally conductive insulating resin sheet 6, the resin flowing out of thermally conductive insulating resin sheet 6 can be stopped at convex portion 11. Further, since the space enclosed by convex portion 11 is hermetically sealed, internal pressure within thermally conductive insulating resin sheet 6 increases. As a result of the increased internal pressure within thermally conductive insulating resin sheet 6, the air (voids) can be crushed more readily within thermally conductive insulating resin sheet 6. As a result, the partial discharge starting voltage at thermally conductive insulating resin sheet 6 can be improved. Therefore, the insulation reliability of semiconductor module 100 can be improved.

Semiconductor module 100 shown in FIG. 7 basically has a similar configuration and can produce similar effects to those of semiconductor module 100 shown in FIG. 6, but is different from semiconductor module 100 shown in FIG. 6 in the structure of convex portion 11 in semiconductor device 20. Specifically, in semiconductor module 100 shown in FIG. 7, an inner peripheral surface of convex portion 11 of semiconductor device 20 is a tapered portion 11a. Tapered portion 11a is a surface of portion of convex portion 11 facing thermally conductive insulating resin sheet 6. Tapered portion 11a is inclined relative to first surface 7a of heat dissipation member 7. The distance between tapered portion 11a and first surface 7a decreases toward the side surface of semiconductor device 20. From a different viewpoint, the distance between tapered portion 11a and first surface 7a decreases with increasing distance from thermally conductive insulating resin sheet 6. In this case, during the bonding of semiconductor device 20 and heat dissipation member 7 by pressurization and heating of thermally conductive insulating resin sheet 6, the resin and the air flowing within thermally conductive insulating resin sheet 6 tend to be concentrated on the heat dissipation member 7 side in the vicinity of convex portion 11. Accordingly, the voids on the heat sink 3 side within thermally conductive insulating resin sheet 6 can be reduced. As a result, the partial discharge starting voltage at thermally conductive insulating resin sheet 6 can be further improved, to improve the insulation reliability of semiconductor module 100.

Semiconductor module 100 shown in FIG. 8 basically has a similar configuration and can produce similar effects to those of semiconductor module 100 shown in FIG. 6, but is different from semiconductor module 100 shown in FIG. 6 in the structure of convex portion 11 in semiconductor device 20. Specifically, in semiconductor module 100 shown in FIG. 8, a step portion 11b is formed in the inner peripheral surface of convex portion 11 of semiconductor device 20. Step portion 11b includes a first step 11ba and a second step 11bb. The number of steps included in step portion 11b may be two as shown in FIG. 8, but three or more steps may be included. In step portion 11b, the step closer to the outer periphery of semiconductor device 20 preferably has a smaller distance from first surface 7a of heat dissipation member 7.

<Functions and Advantageous Effects>

In the semiconductor module described above, convex portion 11 is formed at surface portion 20a of semiconductor device 20, the convex portion located outward of partial region 20aa and surrounding the outer periphery of thermally conductive insulating resin sheet 6. Concave portion 8 is formed in convex portion 11. In this case, during the bonding of semiconductor device 20 and heat dissipation member 7 by pressurization and heating of thermally conductive insulating resin sheet 6, the resin flowing out of thermally conductive insulating resin sheet 6 can be stopped at convex portion 11. Further, if the space enclosed by convex portion 11 can be hermetically sealed, the internal pressure within thermally conductive insulating resin sheet 6 can be increased. As a result of the increased internal pressure within thermally conductive insulating resin sheet 6, the air (voids) can be crushed more readily within thermally conductive insulating resin sheet 6. As a result, the partial discharge starting voltage at thermally conductive insulating resin sheet 6 can be improved. Therefore, the insulation reliability of semiconductor module 100 can be improved.

Fifth Embodiment

<Configuration of Semiconductor Module>

Figure 9:
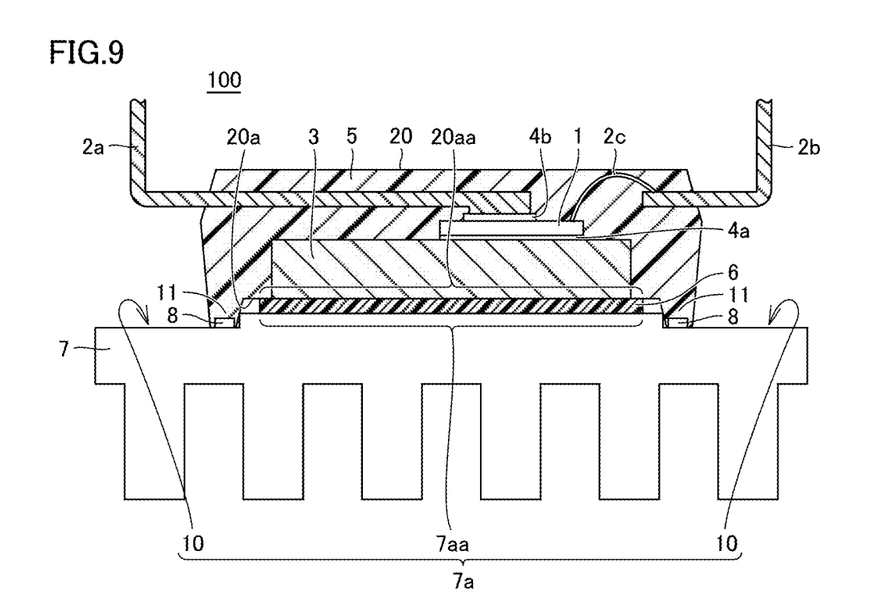
FIG. 9 is a schematic cross-sectional view of a semiconductor module according to a fifth embodiment.
Figure 10:
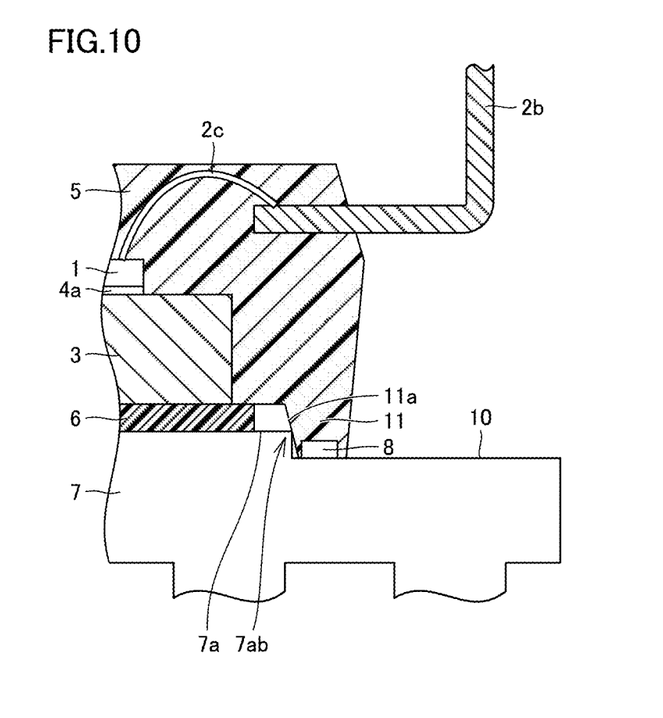
FIG. 10 is an enlarged partial schematic cross-sectional view of the semiconductor module shown in FIG. 9.
Figure 11:
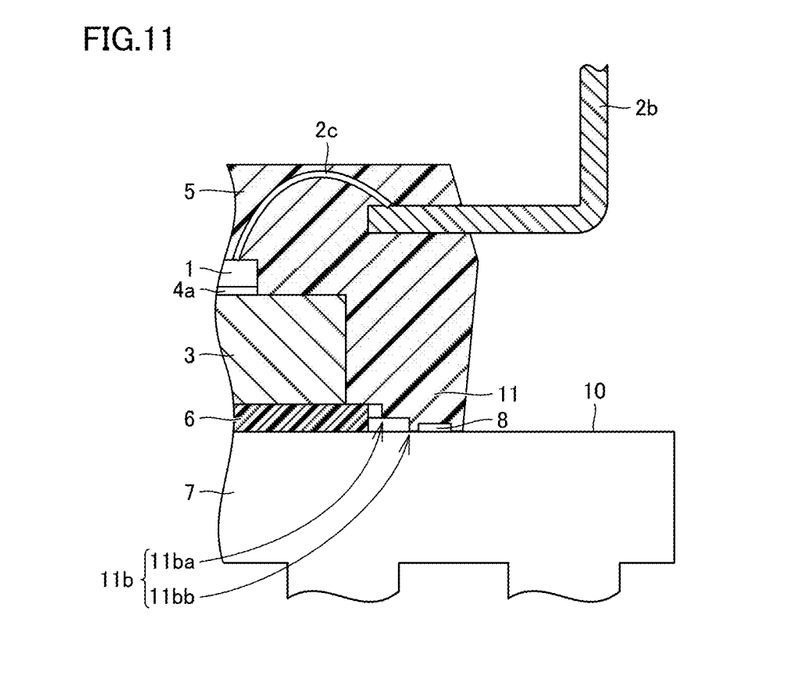
FIG. 11 is an enlarged partial schematic cross-sectional view showing a modification of the semiconductor module according to the fifth embodiment.

FIG. 9 is a schematic cross-sectional view of a semiconductor module according to a fifth embodiment. FIG. 10 is an enlarged partial schematic cross-sectional view of the semiconductor module shown in FIG. 9. FIG. 11 is an enlarged partial schematic cross-sectional view showing a modification of the semiconductor module according to the fifth embodiment.

Semiconductor module 100 shown in FIGS. 9 and 10 basically has a similar configuration and can produce similar effects to those of semiconductor module 100 shown in FIG. 7, but is different from semiconductor module 100 shown in FIG. 7 in that heat-dissipation-member-side step portion 10 is formed in the outer peripheral portion of first surface 7a of heat dissipation member 7. Specifically, in semiconductor module 100 shown in in FIGS. 9 and 10, in a part of first surface 7a of heat dissipation member 7 that is located outward of portion 7aa connected to thermally conductive insulating resin sheet 6, heat-dissipation-member-side step portion 10 which is further away from semiconductor device 20 than portion 7aa is formed. Heat-dissipation-member-side step portion 10 preferably has a depth of 0.6 mm or more, for example, as in semiconductor module 100 shown in FIG. 5.

In a plan view of semiconductor module 100, heat-dissipation-member-side step portion 10 partially overlaps each of metal wiring members 2a and 2b. Heat-dissipation-member-side step portion 10 is formed to surround the outer periphery of thermally conductive insulating resin sheet 6. Convex portion 11 of semiconductor device 20 may be fitted into heat-dissipation-member-side step portion 10. Specifically, a corner portion lab, which is an end portion of first surface 7a of heat dissipation member 7 on the inner peripheral side of heat-dissipation-member-side step portion 10, may be in contact with tapered portion 11a, which is the inner peripheral surface of convex portion 11 of semiconductor device 20. In this case, as in semiconductor module 100 according to the fourth embodiment, during the bonding of semiconductor device 20 and heat dissipation member 7 by pressurization and heating of thermally conductive insulating resin sheet 6, the resin and the air flowing within thermally conductive insulating resin sheet 6 tend to be concentrated on the heat dissipation member 7 side in the vicinity of convex portion 11. Accordingly, the occurrence of voids within thermally conductive insulating resin sheet 6 can be suppressed. As a result, the partial discharge starting voltage at thermally conductive insulating resin sheet 6 can be further improved, to improve the insulation reliability of semiconductor module 100. Further, the spatial distance and the creepage distance between metal wiring members 2a, 2b exposed outside molding resin portion 5 and heat dissipation member 7 can be relatively increased. Accordingly, size increase of semiconductor module 100 can be suppressed, and size and cost reductions of semiconductor module 100 can be achieved.

Semiconductor module 100 shown in FIG. 11 basically has a similar configuration and can produce similar effects to those of semiconductor module 100 shown in FIGS. 9 and 10, but is different from semiconductor module 100 shown in FIGS. 9 and 10 in the structure of convex portion 11 in semiconductor device 20. Specifically, in semiconductor module 100 shown in FIG. 11, step portion 11b is formed at the inner peripheral surface of convex portion 11 of semiconductor device 20. Step portion 11b includes first step 11ba and second step 11bb. As in semiconductor module 100 shown in FIG. 8, the number of steps included in step portion 11b may be two, but three or more steps may be included. In step portion 11b, the step closer to the outer periphery of semiconductor device 20 preferably has a smaller distance from the surface of heat-dissipation-member-side step portion 10 of heat dissipation member 7.

<Functions and Advantageous Effects>

In semiconductor module 100 described above, first surface 7a of the heat dissipation member includes heat-dissipation-member-side step portion 10. Heat-dissipation-member-side step portion 10 surrounds portion 7aa connected to thermally conductive insulating resin sheet 6 in a plan view, and is further away from semiconductor device 20 than portion 7aa. Convex portion 11 of semiconductor device 20 is in contact with heat-dissipation-member-side step portion 10.

In this case, during the bonding of semiconductor device 20 and heat dissipation member 7 by pressurization and heating of thermally conductive insulating resin sheet 6, the occurrence of voids within thermally conductive insulating resin sheet 6 can be suppressed. As a result, the partial discharge starting voltage at thermally conductive insulating resin sheet 6 can be improved, to improve the insulation reliability of semiconductor module 100. Further, the spatial distance and the creepage distance between metal wiring members 2a, 2b exposed outside molding resin portion 5 and heat dissipation member 7 can be relatively increased. Accordingly, size and cost reductions of semiconductor module 100 can be achieved.

Sixth Embodiment

The present embodiment is an application of the semiconductor module according to any one of the first to fifth embodiments described above to a power conversion device. While the present invention is not limited to a certain power conversion device, an example where the present invention is applied to a three-phase inverter will be described below as a sixth embodiment.

Figure 12:
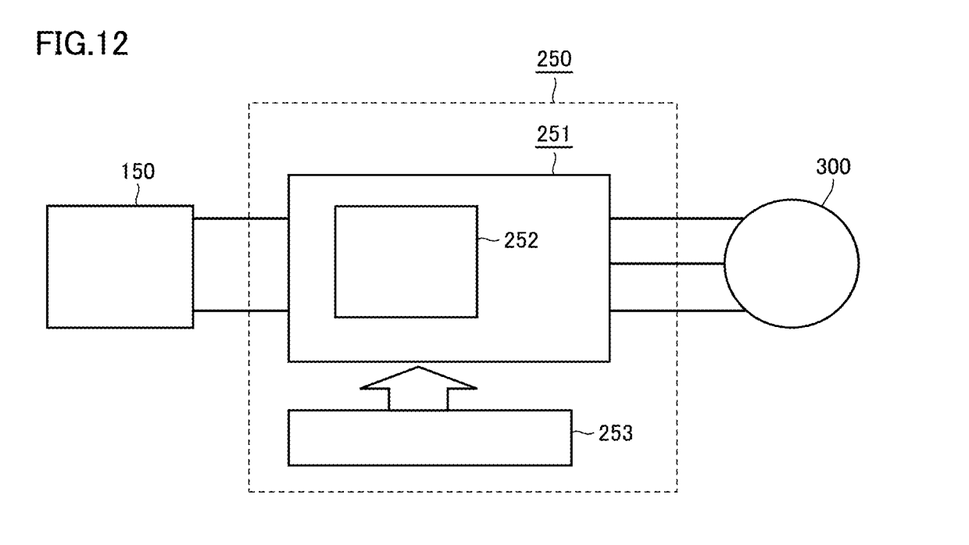
FIG. 12 is a block diagram showing a configuration of a power conversion system according to a sixth embodiment.

FIG. 12 is a block diagram showing a configuration of a power conversion system to which the power conversion device according to the present embodiment is applied.

The power conversion system shown in FIG. 12 includes a power supply 150, a power conversion device 250, and a load 300. Power supply 150 is a DC power supply, and supplies DC power to power conversion device 250. Power supply 150 can be implemented by a variety of components, for example, a DC system, a solar cell, or a storage battery, or may be implemented by a rectifying circuit or an AC/DC converter connected to an AC system. Alternatively, power supply 150 may be implemented by a DC/DC converter to convert DC power output from a DC system to prescribed power.

Power conversion device 250 is a three-phase inverter connected between power supply 150 and load 300, and converts DC power supplied from power supply 150 to AC power for supply to load 300. As shown in FIG. 12, power conversion device 250 includes a main conversion circuit 251 to convert DC power to AC power for output, and a control circuit 253 to output a control signal for controlling main conversion circuit 251 to main conversion circuit 251.

Load 300 is a three-phase motor driven by AC power supplied from power conversion device 250. Load 300 is a motor mounted on a variety of electric devices, without being limited to a certain application. Load 300 is used as a motor for, for example, a hybrid car, an electric car, a railroad vehicle, an elevator, or an air conditioner.

The details of power conversion device 250 are now described. Main conversion circuit 251 includes switching elements and freewheeling diodes (not shown). Switching of the switching elements causes DC power supplied from power supply 150 to be converted to AC power and supplied to load 300. While there are a variety of specific circuit configurations of main conversion circuit 251, main conversion circuit 251 according to the present embodiment is a two-level, three-phase full bridge circuit, which can be implemented by six switching elements and six freewheeling diodes in anti-parallel with the respective switching elements. Each switching element and each freewheeling diode of main conversion circuit 251 are implemented by a semiconductor module 252 corresponding to that according to any one of the first to fifth embodiments described above. The six switching elements are connected in series two by two to form upper and lower arms, and the upper and lower arms each constitute each phase (U phase, V phase, W phase) of the full bridge circuit. Output terminals of the upper and lower arms, that is, three output terminals of main conversion circuit 251 are connected to load 300.

Main conversion circuit 251 also includes a drive circuit (not shown) that drives each switching element. The drive circuit may be contained in semiconductor module 252, or may be provided separately from semiconductor module 252. The drive circuit generates a drive signal for driving a switching element of main conversion circuit 251, and supplies the drive signal to a control electrode of the switching element of main conversion circuit 251. Specifically, in accordance with a control signal from control circuit 253 which will be described later, a drive signal for turning on each switching element and a drive signal for turning off each switching element are output to the control electrode of the switching element. To maintain a switching element in the ON state, the drive signal is a voltage signal equal to or high than a threshold voltage of the switching element (ON signal). To maintain a switching element in the OFF state, the drive signal is a voltage signal equal to or lower than a threshold voltage of the switching element (OFF signal).

Control circuit 253 controls the switching elements of main conversion circuit 251 such that desired power is supplied to load 300. Specifically, control circuit 253 calculates, based on power to be supplied to load 300, a time during which each switching element of main conversion circuit 251 should be in the ON state (ON time). For example, main conversion circuit 251 can be controlled by PWM control that modulates the ON time of a switching element depending on the voltage to be output. Then, a control command (control signal) is output to the drive circuit included in main conversion circuit 251 such that the ON signal is output to a switching element to be turned on and the OFF signal is output to a switching element to be turned off at each point in time. In accordance with this control signal, the drive circuit outputs, as the drive signal, the ON signal or the OFF signal to the control electrode of each switching element.

In the power conversion device according to the present embodiment, the semiconductor module according to any one of the first to fifth embodiments is applied as the switching elements and the freewheeling diodes of main conversion circuit 251. Thus, the reliability of the power conversion device can be improved.

While the present invention is described as applied to a two-level, three-phase inverter by way of example in the present embodiment, the present invention is not limited thereto and can be applied to a variety of power conversion devices. While a two-level power conversion device is employed in the present embodiment, a three-level or multi-level power conversion device may be employed. To supply power a single-phase load, the present invention may be applied to a single-phase inverter. To supply power to a DC load and the like, the present invention can also be applied to a DC/DC converter or an AC/DC converter.

In addition, the power conversion device to which the present invention is applied is not limited to the example where the load is a motor as described above, but can be used as a power supply device of, for example, an electric discharge machine, a laser beam machine, an induction heating cooking device, or a contactless power feeding system, and can further be used as a power conditioner of a photovoltaic system, an electricity storage system, or the like.

It should be understood that the embodiments disclosed herein are illustrative and non-restrictive in every respect. At least two of the embodiments disclosed herein can be combined to the extent that is technically consistent. The scope of the present invention is defined by the terms of the claims, rather than the description above, and is intended to include any modifications within the meaning and scope equivalent to the terms of the claims.

REFERENCE SIGNS LIST 1 semiconductor element; 2a, 2b metal wiring member; 2aa terminal portion; 2ab connection portion; 2c wire; 3 heat spreader; 4a, 4b bonding member; 5 molding resin portion; 6 thermally conductive insulating resin sheet; 7 heat dissipation member; 7a first surface; 7aa portion; lab corner portion; 8 concave portion; 9, 11b step portion; 9a, 11ba first step; 9b, 11bb second step; 10 heat-dissipation-member-side step portion; 11 convex portion; 11a tapered portion; 20 semiconductor device; 20a surface portion; 20aa partial region; 100, 252 semiconductor module; 150 power supply; 250 power conversion device; 251 main conversion circuit; 253 control circuit; 300 load.

The invention claimed is:

1. A semiconductor module comprising:
a heat dissipation member having a first surface; and
a semiconductor device disposed on the first surface and having a surface portion facing the heat dissipation member; wherein
a partial surface of the first surface of the heat dissipation member and a partial region of the surface portion of the semiconductor device are connected by a thermally conductive insulating resin sheet, the first surface of the heat dissipation member has a flat surface portion outward of the partial surface, the flat surface portion being continuous with and flush with the partial surface,
the semiconductor device includes
a semiconductor element,
a metal wiring member electrically connected to the semiconductor element and including a terminal portion protruding outside the semiconductor device, and
a heat spreader having an exposed surface exposed at the surface portion of the semiconductor device,
the partial region includes the exposed surface,
in the surface portion of the semiconductor device, a concave portion is formed outward of the partial region to which the thermally conductive insulating resin sheet is connected,
the concave portion is provided to face the flat surface portion of the heat dissipation member,
the surface portion of the semiconductor device located outward of the partial region and inward of the concave portion is spaced apart from the flat surface portion of the heat dissipation member, and an inside of the concave portion is exposed,
the concave portion is located in a region closer to the heat dissipation member than the terminal portion, and
the concave portion has a depth smaller than a thickness of the thermally conductive insulating resin sheet.

2. The semiconductor module according to claim 1, wherein
the surface portion of the semiconductor device includes a step portion, the step portion located outward of the partial region and being further away from the heat dissipation member than the partial region,
the step portion overlaps a portion of the metal wiring member in a plan view, and
the concave portion is formed in the step portion.

3. The semiconductor module according to claim 1, wherein
a convex portion is formed at the surface portion of the semiconductor device, the convex portion located outward of the partial region and surrounding an outer periphery of the thermally conductive insulating resin sheet, and
the concave portion is formed in the convex portion.

4. A power conversion device comprising:
a main conversion circuit to convert input power and output the converted power, the main conversion circuit including the semiconductor module according to claim 1; and
a control circuit to output, to the main conversion circuit, a control signal for controlling the main conversion circuit.

* * * * *